United States Patent
Elworthy

(10) Patent No.: US 9,823,569 B2
(45) Date of Patent: Nov. 21, 2017

(54) RADIATING DEVICE AND MEDIA EXPOSURE DEVICE

(71) Applicant: LumeJet Holdings Limited, Warwickshire (GB)

(72) Inventor: Trevor Philip Elworthy, Warwickshire (GB)

(73) Assignee: LumeJet Holdings Limited, Warwickshire (GB)

( * ) Notice: Subject to any disclaimer, the term of this patent is extended or adjusted under 35 U.S.C. 154(b) by 405 days.

(21) Appl. No.: 14/375,682

(22) PCT Filed: Feb. 1, 2013

(86) PCT No.: PCT/GB2013/050236
§ 371 (c)(1),
(2) Date: Jul. 30, 2014

(87) PCT Pub. No.: WO2013/114131
PCT Pub. Date: Aug. 8, 2013

(65) Prior Publication Data
US 2015/0015866 A1 Jan. 15, 2015

(30) Foreign Application Priority Data
Feb. 1, 2012 (GB) .................... 1201763.8

(51) Int. Cl.
*G03F 7/20* (2006.01)
*B41J 2/45* (2006.01)
(Continued)

(52) U.S. Cl.
CPC ............ *G03F 7/2008* (2013.01); *B41J 2/451* (2013.01); *B41J 2/455* (2013.01); *B41J 2/465* (2013.01);
(Continued)

(58) Field of Classification Search
CPC . B41J 29/377; B41J 2/465; B41J 2/455; B41J 2/451; H04N 1/504; G03G 21/1666; G03G 15/04054
See application file for complete search history.

(56) References Cited

U.S. PATENT DOCUMENTS 4,376,282 A 3/1983 Kotani et al.
4,928,122 A 5/1990 Doi et al.
(Continued)

FOREIGN PATENT DOCUMENTS

EP 0629508 12/1994
EP 1750334 2/2007
(Continued)

OTHER PUBLICATIONS

"International Application No. PCT/GB2013/0502236, International Search Report and Written Opinion dated May 7, 2013", (May 7, 2013), 22 pgs.
(Continued)

*Primary Examiner* — Kristal Feggins
(74) *Attorney, Agent, or Firm* — Schwegman Lundberg & Woessner, P.A.

(57) ABSTRACT

This invention relates to a media exposing device for exposing media. The media exposure device includes a holding structure; a substrate having a plurality of diodes mounted thereon; and a radiation modification element for modifying the radiation emitted by the diodes. The substrate and the radiation modification element are secured by the holding structure in an arrangement wherein the diodes can emit radiation from the device and wherein the radiation modification element is spaced from the diodes in the radiation path of the diodes; and a telecentric lens secured to the holding structure in an arrangement wherein the telecentric lens is substantially in register with the radiation path of the diodes.

15 Claims, 11 Drawing Sheets

(51) Int. Cl.
*B41J 2/455* (2006.01)
*B41J 2/465* (2006.01)
*B41J 29/377* (2006.01)
*G03G 15/04* (2006.01)
*G03G 21/16* (2006.01)
*H04N 1/50* (2006.01)

(52) U.S. Cl.
CPC ...... *B41J 29/377* (2013.01); *G03G 15/04054* (2013.01); *G03G 21/1666* (2013.01); *H04N 1/504* (2013.01)

(56) References Cited

U.S. PATENT DOCUMENTS

| | | |
|---|---|---|
| 5,959,654 A | 9/1999 | Yoshida |
| 6,249,296 B1 | 6/2001 | Nemura et al. |
| 6,266,074 B1 | 7/2001 | Koumura et al. |
| 2001/0040620 A1 | 11/2001 | Wakisaka et al. |
| 2003/0234855 A1 | 12/2003 | Ng |
| 2004/0145546 A1 | 7/2004 | Hyuga |
| 2009/0086328 A1 | 4/2009 | Sowa et al. |
| 2010/0208027 A1 | 8/2010 | Sowa et al. |
| 2011/0050835 A1 | 3/2011 | Sowa et al. |

FOREIGN PATENT DOCUMENTS

| | | |
|---|---|---|
| GB | 2438733 | 12/2007 |
| JP | 08313807 | 11/1996 |
| JP | 2001150724 | 6/2001 |
| JP | 2007030250 | 2/2007 |
| WO | WO-0135633 | 5/2001 |
| WO | WO-2007138318 | 12/2007 |
| WO | WO-2013114131 | 8/2013 |

OTHER PUBLICATIONS

"United Kingdom Application No. GB1201763.8, Search Report Under Section 17 dated Aug. 28, 2012", (Aug. 28, 2012), 1 pg.

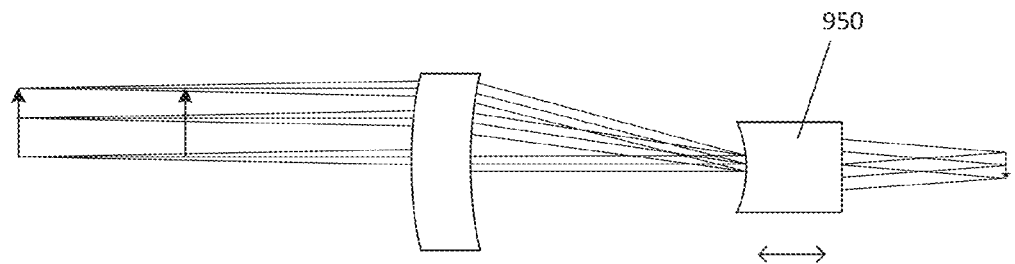
Figure 9
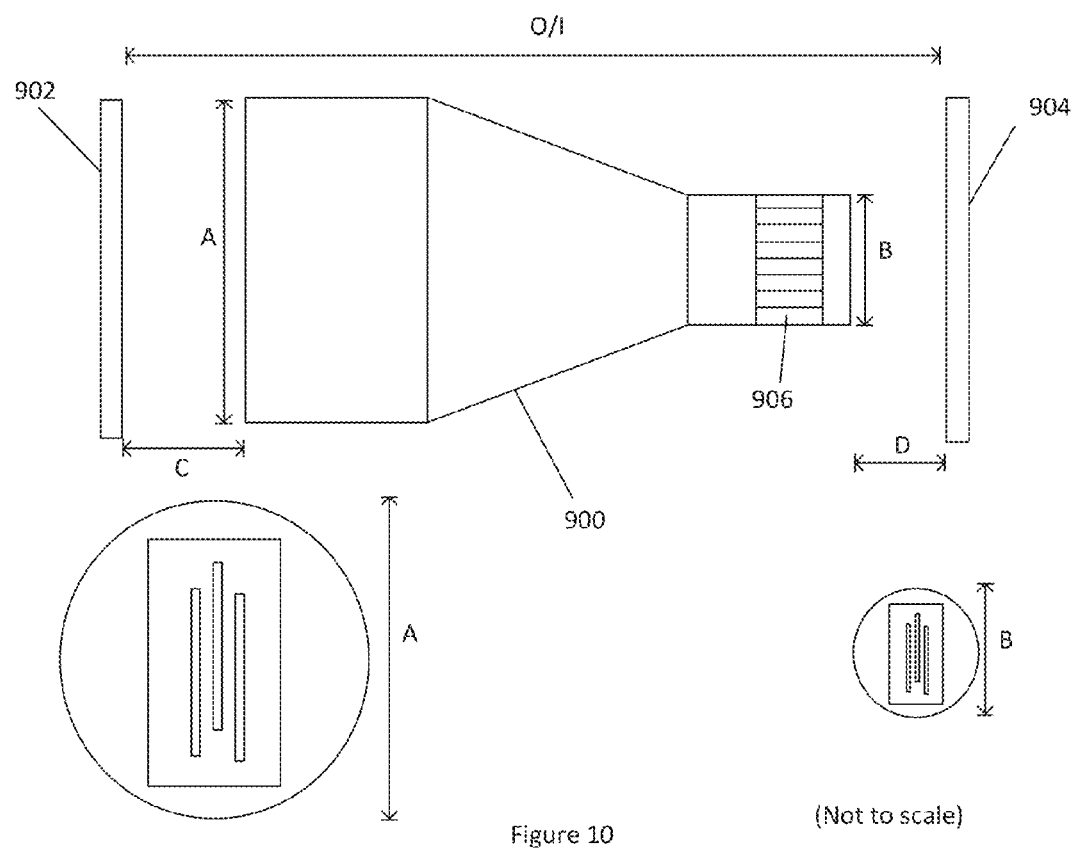
Figure 10 (Not to scale)

RADIATING DEVICE AND MEDIA EXPOSURE DEVICE

PRIORITY CLAIM TO RELATED APPLICATIONS

This application is a U.S. national stage application filed under 35 U.S.C. §371 from International Application Serial No. PCT/GB2013/050236, which was filed Feb. 1, 2013, and published as WO 2013/114131 on Aug. 8, 2013, and which claims priority to United Kingdom Application No. GB 1201763.8, filed Feb. 1, 2012, which applications and publication are incorporated by reference as if reproduced herein and made a part hereof in their entirety, and the benefit of priority of each of which is claimed herein.

This invention relates to a radiating device and to a media exposure device.

In the field of visible/Infra Red (IR)/Ultra Violet (UV) Light Emitting Diode (LED) printing, patterning or marking, it is desirable to have as much control as possible over the position, power, wavelength and other properties of the emitted light so as to produce the highest possible quality printed product. One key part of the process is ensuring that the LEDs themselves are accurately positioned and all emitting the same (or a controlled) spectrum and power of light.

Many LED printers use micro LEDs as the source of light. This is because they have many advantageous properties such as small spot sizes that correspond to high resolution printing. Macro LEDs are also used which have the advantage of having a high power output. In either case, the accurate placement of these LEDs is required. In the case of macro LEDs, they are usually placed onto a Printed Circuit Board (PCB) robotically. Accuracies of around 10 microns are commercially common, but they often slip out of place during mounting or in use. There is therefore a need to ensure that the light emitted illuminates only the correct portion of the print medium. Similar LEDs also vary in the wavelength and power they emit, sometimes by up to 20 nm and 20% respectively. When illuminating a photosensitive medium, the wavelength of the light has a significant influence on how the medium reacts. Pre-selecting LEDs which have exactly the same light spectrum is inefficient and costly. There is therefore a need to control the wavelength of the emitted light after mounting the LEDs onto the PCB.

The present invention aims to solve at least some of these problems.

STATEMENTS OF INVENTION

According to one aspect of the invention, there is provided a radiating device, including: a holding structure; a substrate having a plurality of diodes mounted thereon; and a radiation modification element for modifying the radiation emitted by the diodes; the substrate and the radiation modification element being secured by the holding structure in an arrangement wherein the diodes can emit radiation from the device and wherein the radiation modification element is spaced from the diodes in the radiation path of the diodes.

According to another aspect of the invention, there is provided a media exposure device for exposing media, including: a radiating device as herein described; and a telecentric lens and/or tapered optic fibre bundle secured to the holding structure of the radiating device in an arrangement wherein the telecentric lens and/or optic fibre bundle is substantially in register with the radiation path of the diodes.

Preferably, the radiation modification element includes means for filtering the radiation.

Preferably, the filtering means includes at least one radiation filter layer.

Preferably, the radiation modification element includes a plate which allows the passage therethrough of the radiation, and wherein each radiation filter layer is deposited on said plate.

Preferably, the radiation modification element further comprises means for masking the radiation.

Preferably, the masking means defines a number of apertures, each aperture substantially being in register with the radiation path of a particular one of the diodes.

Preferably, the radiation modification element includes a plate which allows the passage therethrough of the radiation, and wherein the masking means is in the form of an opaque layer deposited on said plate which is opaque to the radiation.

Preferably, each radiation filter layer is deposited on the opaque layer, and more preferably each radiation filter layer covers at least a portion of the apertures Preferably, the diodes are light emitting diodes emitting electromagnetic radiation substantially within the visible spectrum.

Preferably, the diodes are infrared diodes emitting electromagnetic radiation substantially within the infrared spectrum.

Preferably, the diodes are ultraviolet diodes emitting electromagnetic radiation substantially within the ultraviolet spectrum.

Preferably, the radiation modification element is in the form of a glass plate.

Preferably, the radiation modification element is an optic fibre plate in which the fibres are oriented with their axes substantially parallel to the radiation path of the diodes.

Preferably, the holding structure includes a spacing element disposed between the substrate and the radiation modification element.

Preferably, the spacing element defines at least one opening and is disposed in an arrangement wherein each diode is in register with an opening of the spacing element.

Preferably, the spacing element defines a number of slots, each slot being in register with a different subset of the diodes.

Preferably, the spacing element is in the form of a ceramic plate.

Preferably, the holding structure includes at least one heat dissipation element of a material of high thermal conductivity which is secured in contact with at least a portion of the substrate.

Preferably, the radiating device further comprises a front heat dissipation element secured within the holding structure in an arrangement wherein it is in contact with at least a portion of the face of the substrate on which the diodes are mounted.

Preferably, the radiating device further comprises a back heat dissipation element secured within the holding structure in an arrangement wherein it is in contact with at least a portion of the face of the substrate opposite to the face on which the diodes are mounted.

Preferably, the holding structure includes a base plate and a front plate adapted to be coupled to one another thereby to secure the other components of the device between said base and front plates.

Preferably, the base plate is adapted to act as a heat sink

Preferably, the base plate is of aluminium.

Preferably, the front plate includes an aperture in the radiation path of the diodes.

Preferably, the radiating device further comprises temperature sensing elements situated on the diode substrate, preferably in the form of thermistors.

Preferably, the radiating device further comprises means for actively controlling the temperature of the device.

Preferably, the means for actively controlling the temperature of the device comprises a Peltier device.

Preferably, the means for actively controlling the temperature of the device comprises an air blower.

Preferably, the temperature sensing elements and the temperature controlling means form a feedback control loop for actively cooling the device.

Preferably, the diodes are spaced substantially at a predetermined distance from the telecentric lens and the telecentric lens is image-space telecentric, thereby focusing radiation emitted by the diodes at a distance which is within a particular range of distances from the device.

Preferably, each of the diodes is spaced substantially within a predetermined range of distances from the telecentric lens and the telecentric lens is bi-telecentric, thereby focusing radiation emitted by the diodes at a distance which is within a particular range of distances from the device.

Preferably, the object aperture of the telecentric lens is of a size corresponding to the cross-sectional area of the radiation path of the diodes at the object aperture.

Preferably, the image aperture of the telecentric lens is of a size corresponding to the desired resolution to be achieved on the media.

Preferably, the telecentric lens has a magnification factor of between 2:1 and 10:1, and preferably between 4:1 and 6:1, more preferably 5:1, and yet more preferably 4.72:1.

Preferably, the telecentric lens comprises means for adjusting its image lens.

Preferably, the adjustment means comprises a bevel adjuster for adjusting the position of the image lens.

Preferably, the telecentric lens is made of fused quartz.

Preferably, the telecentric lens is made of fused silica.

The terms medium/media, as used herein, refer to any media that may be optically exposed so that an image, pattern or mark can then be generated on the media. An illustrative example of such media is photographic paper. It should also be remembered that where the term 'printing' or other related terms are used, we do not intend to refer to the deposition of inks and such like onto media. In general terms, 'printing' in the context of the present application is the exposure of print media with light and/or radiation, and the treatment of that media to yield an image, pattern or mark.

According to one broad aspect of the invention, there is provided an LED array optically coupled to a telecentric lens system.

According to another aspect of the invention, there is provided an LED array mounting structure including an LED array and a lens system, wherein the lens system is optically coupled to the LED array and is adapted to image the LED array onto a print medium at a reduced size, the lens system being a telecentric lens system.

Preferably, the telecentric lens has image-space telecentricity.

More preferably, the telecentric lens is bi-telecentric.

The present invention also extends to a method of printing using a telecentric lens and radiating device combined to form a media exposure device.

According to another aspect of the invention, there is provided a media exposure device for exposing media, including a radiating device as described herein and above; and a telecentric lens secured to the holding structure of the radiating device in an arrangement wherein the telecentric lens is substantially in register with the radiation path of the diodes.

According to another aspect of the invention, there is provided a media exposure device for exposing media, including a radiating device as described herein and above; and a tapered bundle of optic fibres of a predetermined length and having substantially the same orientation, each fibre having substantially the same tapered profile, the tapered bundle thereby defining a planar wide end and a planar narrow end; the tapered bundle being secured to the holding structure of the radiating device in an arrangement wherein its wide end is substantially in register with the radiation path of the diodes. The tapered bundle of optic fibres being described in more detail in WO0135633 published 17 May 2001 with the title 'Digital Photographic Reproduction Apparatus' which is hereby incorporated in its entirety by reference.

Telecentric lenses can be manufactured in a very consistent manner with little discrepancy in their magnification properties. The use of telecentric lenses in this context thus affords the advantage of being able to produce print heads with lenses of substantially identical magnification, resulting in more accurate printing.

Telecentric lens may be transparent to UV light. This affords the advantage of being able to print using UV LEDs or other UV radiating elements.

In addition, telecentric lenses have a much larger depth of field than other optical systems, meaning that the spot size does not deviate greatly if the print medium varies in distance from the lens. This affords the advantage of reduced printing errors which would have been caused by the print medium varying in distance from the lens.

The invention extends to any novel aspects or features described and/or illustrated herein.

Further features of the invention are characterised by the other independent and dependent claims.

The invention extends to methods and/or apparatus substantially as herein described with reference to the accompanying drawings.

Any apparatus feature as described herein may also be provided as a method feature, and vice versa. As used herein, means plus function features may be expressed alternatively in terms of their corresponding structure, such as a suitably programmed processor and associated memory.

Any feature in one aspect of the invention may be applied to other aspects of the invention, in any appropriate combination. In particular, method aspects may be applied to apparatus aspects, and vice versa. Furthermore, any, some and/or all features disclosed in the description, and (where appropriate) the claims and drawings in one aspect can be applied to any, some and/or all features in any other aspect, in any appropriate combination.

It should also be appreciated that particular combinations of the various features described and defined in any aspects of the invention can be implemented and/or supplied and/or used independently.

Each feature disclosed in the description, and (where appropriate) the claims and drawings may be provided independently or in any appropriate combination.

BRIEF DESCRIPTION OF THE DRAWINGS

The invention is now described, purely by way of example, with reference to the accompanying drawings, in which:

FIG. 9 shows a ray diagram of a telecentric lens system;

FIG. 10 shows an example telecentric lens adapted for use with the radiating device of FIG. 1;

DETAILED DESCRIPTION

Figure 1A:
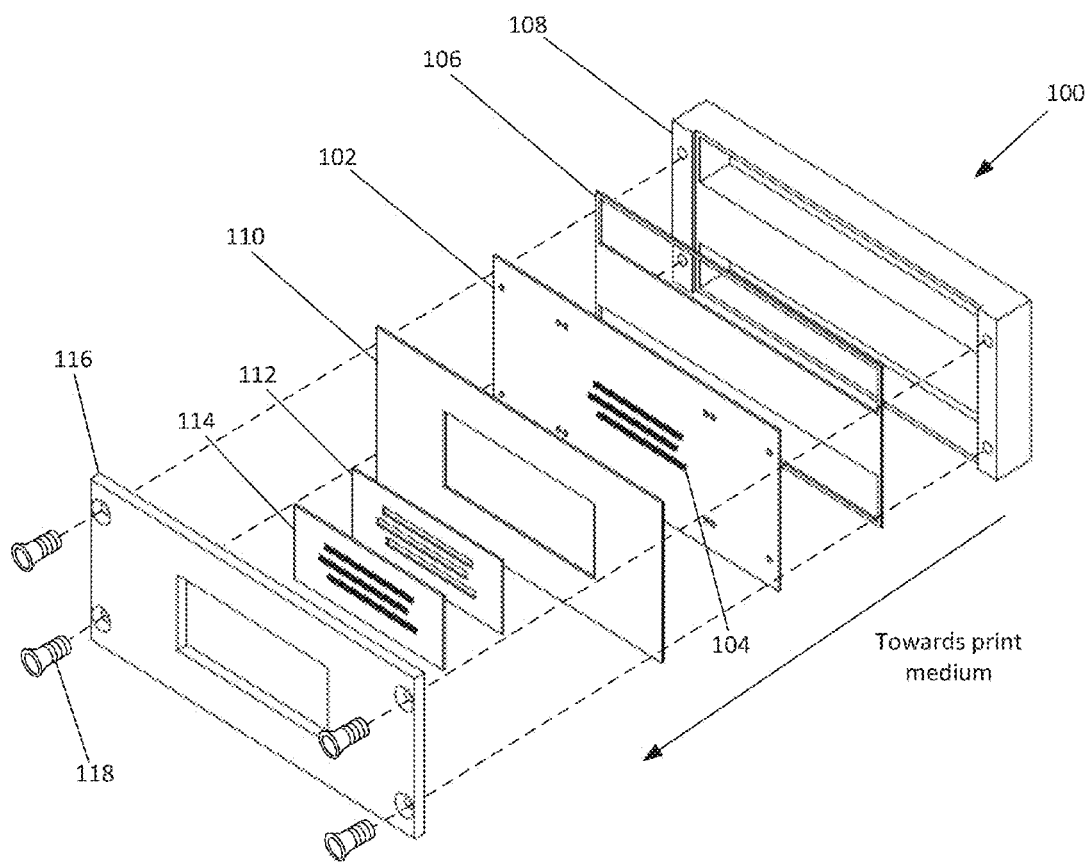
FIG. 1(a) shows an exploded view of a radiating device according to one aspect of the invention.
Figure 3:
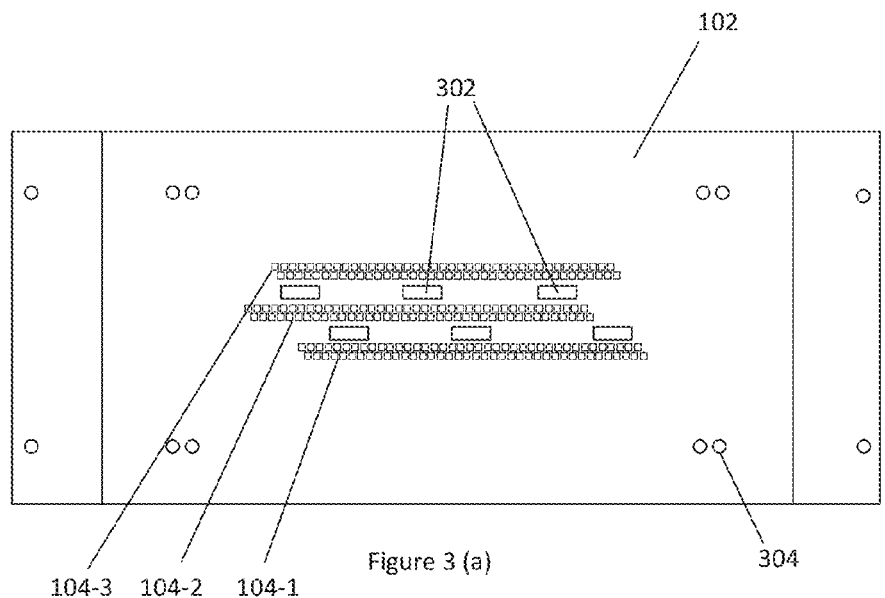
FIGS. 3(a)-(d) show an example LED substrate of the radiating device of FIG. 1.
Figure 3:
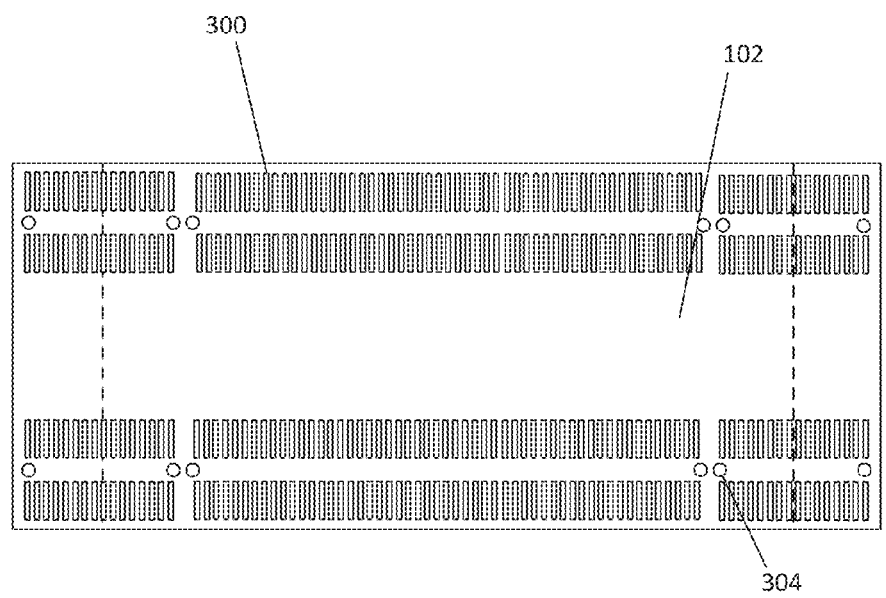

The radiating device 100 shown in FIG. 1(a) contains numerous elements constructed around an LED substrate 102. The LEDs 104 are mounted to the substrate, preferably in strips. In the example shown, three strips are illustrated, corresponding to an embodiment where full colour printing is achieved via Red, Blue and Green (RBG) LEDs 104 exciting different active elements of a print medium. The substrate 102 is described in more detail below with reference to FIG. 3.

The radiating device 100 is adapted to form part of a larger print head unit which, in combination with appropriate additional mechanical and electrical components, together with a lens system in certain examples, selectively exposes a print medium (such as photographic paper) in order to produce a patterned article. In this document, the term LED is used to refer to a Light Emitting Diode adapted to radiate light of any wavelength unless otherwise stated, that is, including ultraviolet, visible and infrared 'light'.

The substrate 102 is mounted onto a thermal pad 106 which is situated further away from the print medium when in use (as indicated by FIG. 1(a)). This aids the dispersal of heat produced by the LEDs 104 themselves. Without temperature controlling precautions, the LEDs 104 would heat up in use which would cause a number of unwanted side effects. In particular, the optical properties of the LEDs and of other elements in the system are temperature dependant, which affects performance. In extreme circumstances excessive heat can cause severe damage to the LEDs 104. The thermal pad 106 is in thermal contact with the substrate at least adjacent to the area of the substrate to which the LEDs 104 are mounted, as this is where the majority of the heat is produced. Active temperature control may also be provided as is described in more detail below.

Below the substrate 102 (towards the print media) is another thermal pad 110. This is similar to the thermal pad 106, but is shaped so that it does not obscure the light emitted from the LEDs 104. The substrate is thus 'sandwiched' between the two thermal pads 106, 110. These heat pads are described in more detail below with reference to FIGS. 5 and 6.

Above the first heat pad 106 (further away from the print media) is a back plate 108. In the example shown in FIG. 1, this conforms to the shape of the heat pad 106. This is made out of a material with a low thermal resistance (high thermal conductance) such as aluminium. This acts to guide the heat produced by the LEDs 104 away from the LEDs 104, and to dissipate it into the surrounding environment, or into a further heat sink (not shown).

Below the lower thermal pad 110 (towards the print media) is a spacing element 112 (preferably in the form of a ceramic plate). This plate 112 is provided with three parallel apertures, and the plate 112 is positioned so that these apertures are located in register with each of the three LED strips. This is discussed in more detail below with reference to FIG. 4.

Adjacent to the spacing element 112, further towards the print media, is the radiation modification element 114. This element 114 modifies the properties of the light passing through the system, which is discussed in more detail below with reference to FIG. 2.

The component shown to be nearest the print media in FIG. 1 is front plate 116. This adds to the structural rigidity of the device as a whole, and, together with back plate 108, enables all the components to be securely fastened together by screws 118. The front plate 116 and back plate 108 are shown in more detail in FIGS. 7 and 8 respectively.

Figure 1B:
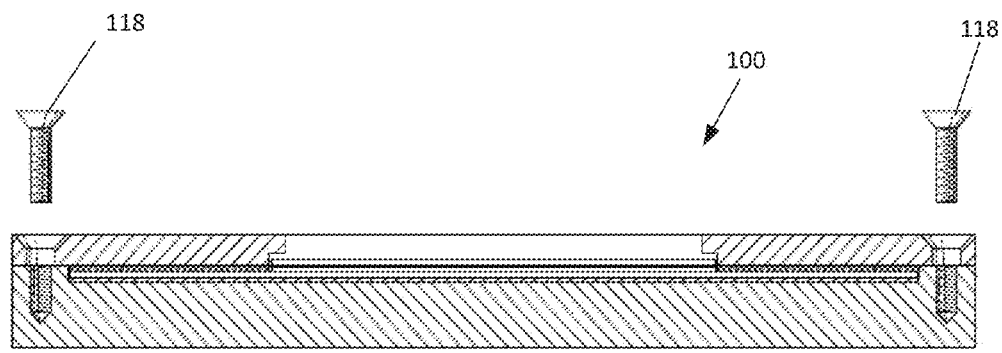
FIG. 1(b) shows a cross-sectional side view of the radiating device of FIG. 1(a) when assembled.

FIG. 1(b) shows a side view of the assembled radiating device. Screws 118 pass through apertures 700 (shown in FIG. 7) provided in the top plate 116 and screw into screw-threaded cavities 800 provided in the back plate 108. By tightening these screws 118, the components are secured in place.

Figure 2:
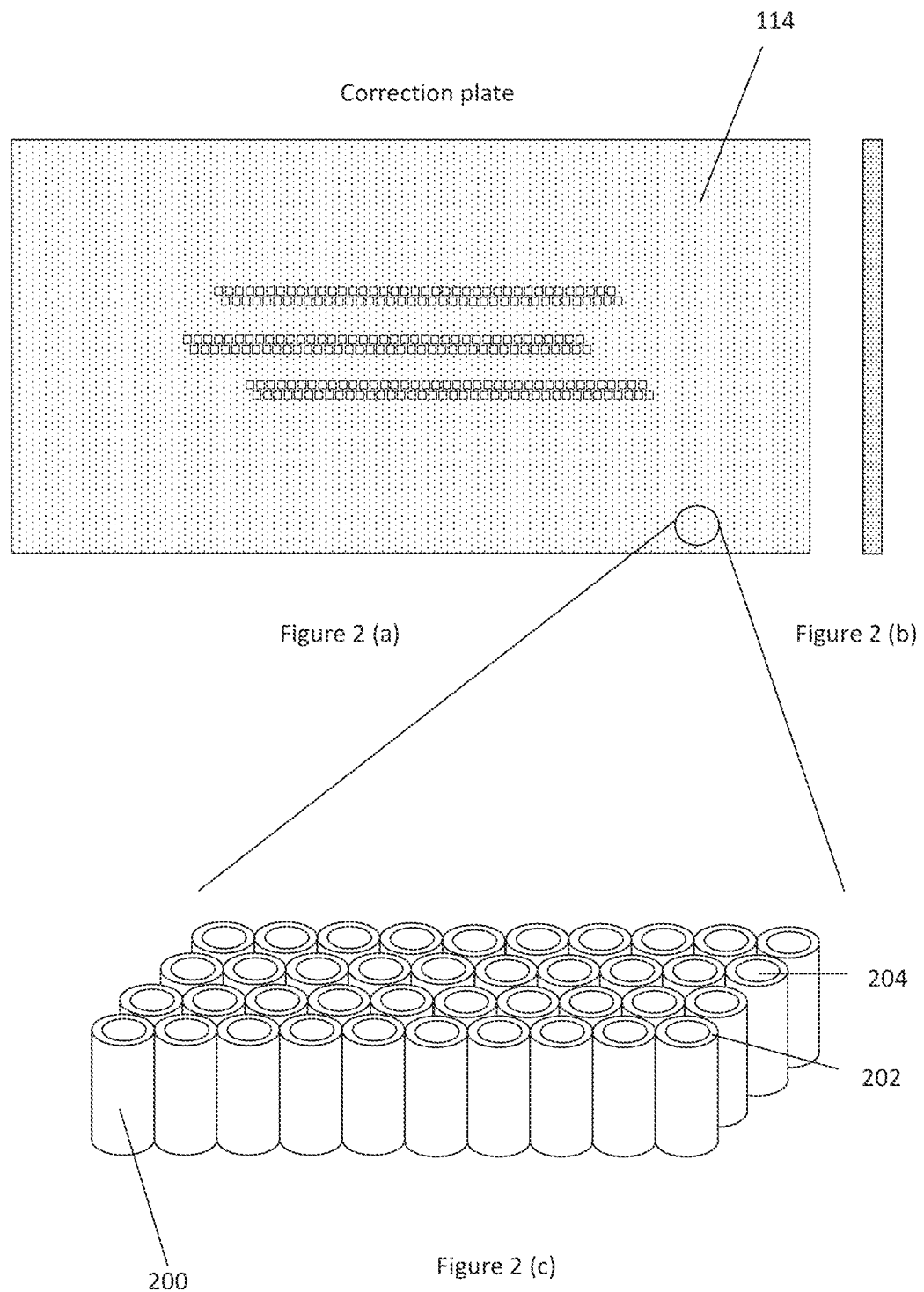
FIGS. 2(a) and (b) show a radiation modification element of the radiating device of FIG. 1.
FIG. 2(c) shows an enlarged view of one example of the construction of the radiation modification element of FIG. 2.
FIG. 2(d) shows a graph depicting example spectral properties of the LEDs, print media and radiation modification element.
Figure 2:
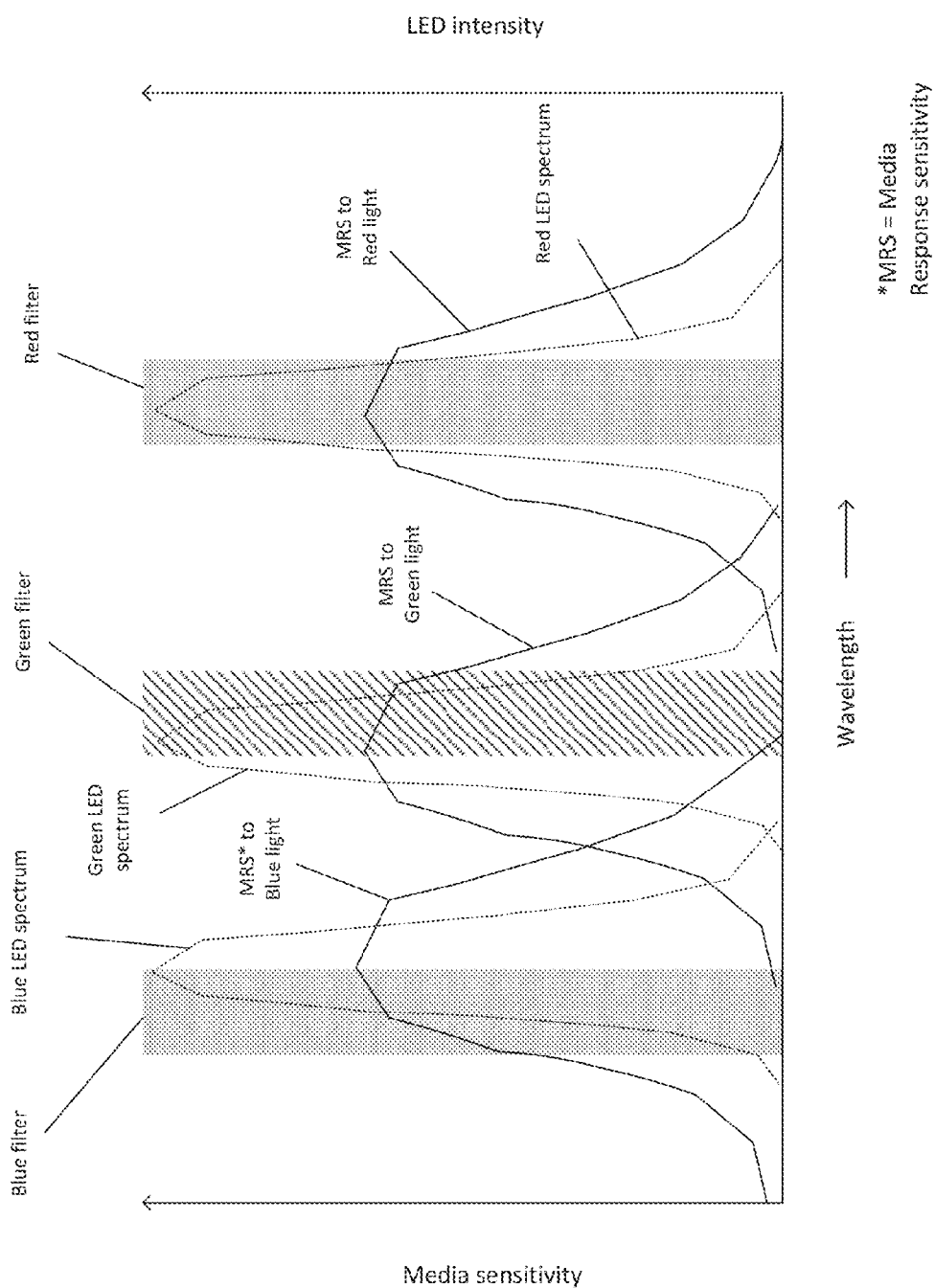

FIG. 2 shows the radiation modification plate (or correction plate) 114 in more detail. In order to correct for inaccurately placed LEDs 104, the radiation modification plate 114 is provided with a mask. This mask is an optically opaque material (for the relevant wavelength(s) of light being used) that is applied onto the plate 114 using Physical Vapour Deposition (PVD). This process applies a very thin layer of the opaque material (several atoms thick) in a very precise pre-defined pattern. Alternatively this could be achieved by Chemical Vapour Deposition (CVD), hand coating and/or use of gelatine filters. In any such example, the pattern is to cover the plate 114 whilst leaving uncovered the desired locations of the LEDs 104. Any misplaced LEDs will have the light they emit blocked from transmitting further towards the print medium. The power that reaches the print medium from these misplaced LEDs would be less than accurately placed LEDs, but by a negligible amount if the misplacement is small. The defects in printing due to errors of this kind are far less serious than the defects created by misalignment and cross-talk between neighbouring LEDs. In one example, the mask is placed on the side nearest the LEDs (furthest away from the print medium). This reduces the possibility of diffraction and cross talk by minimising the amount of light entering the radiation modification plate 114. In a further example, the mask might be placed on the other side of the plate 114.

Further to this opaque coating, subsequent coatings are applied in a similar manner, either applied on the same side as the mask or on the opposing side. These coatings alter the properties of the light which could affect the quality of the final printed product, namely the emission spectrum of the LEDs. These filters may again be applied onto the plate using PVD, CVD, hand coating and/or use of gelatine filters. In the example shown, there are three strips of LEDs; red, blue and green. It is important that each LED is of the same colour as the others in the strip. This is because the print media has a wavelength dependent sensitivity. Even if LEDs are produced in identical conditions, their peak wavelength may vary by up to 20 nm, which is enough to produce noticeable errors in the final printed product. Furthermore, the LEDs may produce light with a spectrum which extends into other active areas of the print media. For example, in the RBG example given, the wavelength response of some media is such that part of the 'green' sensitive area can be activated by the tail of the spectrum from a blue LED. There is therefore a need to constrain the wavelength of the LEDs within a tight window. Band pass filters which block light of unwanted wavelengths are employed for this purpose. The filters are deposited onto the specified areas of the radiation modification plate 114, for example, a filter for blue light is applied over the areas through which the blue light is radiated. Alternatively, a single filter with 'windows' at each of the relevant wavelength bands could be applied, covering each of the three different colour LED strips. This would mean fewer PVD iterations, and potentially less additional material through which the light needs to pass.

In the RBG example, there may not be a need for a 'red' filter as there is negligible overlap between the red sensitive spectrum of the media with that of other colours. In this case, only green and blue filters would be necessary. The filters shown in FIG. 2(d) are illustrated schematically and in reality are 'bandpass' filters, which cut off wavelengths above or below a certain wavelength. They will also not have perfectly sharp edges, rather have a steep drop off and a small 'tail'. This is described in more detail below with reference to FIG. 2(d).

The radiation modification plate 114, in one example, is a sheet of glass, approximately 0.5 mm-1 mm thick, preferably around 0.69 mm thick. In one example, the glass used is optical grade glass so that there is less scattering or attenuation and that a broader spectrum of light can be transmitted through it. However it is also possible to use standard glass.

In a preferred example, the radiation modification plate 114 is a sheet of 'glass fibres', or an 'optic fibre plate' as shown by FIG. 2(c). This is a collection of optical fibres collected or bundled and fused together. This would also be approximately 0.5 mm-1 mm thick, preferably around 0.69 mm. FIG. 2(c) shows a magnified view of such a construction. The plate 114 is comprised of a large number of individual optical fibres 200 which have been bundled and fused together. In one example each optical fibre 200 is around 18-20 μm in diameter. Typically the plate is formed by "salami-slicing" or shaving off a section of a length of fused optical fibres thereby forming the plate 200. Each optical fibre 200 consists of cladding 202 and a core 204.

This construction provides a number of advantages over a sheet of glass. In particular, there is less scope for cross-talk between neighbouring LEDs, and scattering in the radiation modification plate 114 is reduced. The fibres 200 have a low Numerical Aperture (NA), meaning that there is less 'cross talk' between neighbouring LEDs. The light is also guided down much more accurately through the plate 200. The fibres 200 guide the light directly down, whereas a glass plate would allow some spreading, which would eventually lead to errors on the final printed item. The use of a fibre plate is also preferable when using a 'fibre taper' as discussed below as the fibre-to-fibre interface results in less scattering and other losses than a glass-to-fibre interface.

FIG. 2(d) shows the spectrum of LEDs, medium response sensitivity and filters, illustrating the function of the filters. In an ideal system, each LED would emit a single wavelength of light which exactly corresponds with a single wavelength to which the media is sensitive. In real systems this is not the case as the LEDs emit light in a range of wavelengths, and the media is sensitive to a range of wavelengths. As shown in FIG. 2(d), the radiation from certain LEDs can excite the media in a range of varying colours. This is best seen with the 'Blue LED spectrum' overlapping with the 'media response sensitivity to green light' curves. The result of such overlap means that LED light that is meant to activate 'blue' in the media, also activates 'green' (and vice versa). This leads to errors in the final colour of the printed item. To overcome this, filters are employed so that only light that activates the correct colour on the print media is transmitted to the print medium. These band-pass filters are shown schematically by dashed blocks in FIG. 2(c), indicating the wavelength range that is allowed to propagate. There is a trade off between letting more light through and avoiding overlap which is dependent on a number of factors such as the speed and quality of printing required.

FIG. 3(a) shows a more detailed view of the front face (light emitting side) of the LED substrate 102. There are approximately 100 individual LEDs 104 in each strip, each 0.4 mm wide, which together span a width of approximately 40 mm. In another example, LEDs with a die size of between 0.3 mm and 1 mm are used. The LEDs are mounted to the substrate using surface mounting techniques. Each set of 100 LEDs 104-1, 104-2, 104-3 are arranged in two rows of 50 so that the emission profiles of adjacent LEDs 104 in each row overlap to such a degree that components of an image, pattern or mark printed on a photo-sensitive medium and attributable to adjacent LEDs are not readily resolvable. In an alternative example, the LEDs might be arranged in a single row in a non-overlapping fashion. The different rows 104-1, 104-2, 104-3 are shown to be linearly offset from one another; this is to avoid 'banding' where errors in the movement of the print head results in under or over exposure between print swathes. This linear offset means that the join between adjacent swathes of the final image resulting from exposure of the photographic medium by the red row 104-1 (say) occurs at a different location on the photosensitive medium to joins between adjacent swathes of that image which are attributable to the blue and green rows 104-2, 104-3. In an alternative example, the different rows 104-1, 104-2, 104-3 are arranged with their ends substantially aligned. Further details relating to the LED array are provided in WO2007138318, published 6 Dec. 2007 with the title 'Improvements Relating to Optical Printers' which is incorporated in its entirety herein by reference.

In the example of an RBG array, the wavelengths of the different rows 104-1, 104-2 and 104-3 would be 690-700 nm (R), 430-440 nm (B) and 540-550 nm (G).

In addition to the passive temperature management elements described above, in certain examples, active cooling control is provided. The wavelength and power of light emitted from the LEDs varies depending on the ambient temperature, and in one example, temperature control of the LEDs within a range of 0.5° C. is necessary. In one example, the active cooling elements are in the form of a Peltier element and/or an air-blower situated outside the radiating device 100. In one example, in addition to the LEDs 104, there are also thermistors 302 mounted on the substrate 102. These are preferably spaced as close to the LED strips 104-1, 2, 3 as possible, in one example, between the strips. The placement of thermistors 302 enables accurate temperature measurements of the LEDs 104 to be taken. These measurements can be fed to the active cooling elements to effect feedback temperature control of the substrate 102.

FIG. 3(c) shows a more detailed view of the rear face of the LED substrate 102. This shows a number of connectors 300 which enable the individual LEDs to be connected via wire-bonding to further circuitry to control individually the power and timing of each of the LEDs. In one example Application Specific Integrated Circuits (ASICs) or Field Programmable Gate Arrays (FGPAs) are used for this purpose. In certain examples, two connectors 300 for each LED, and two for each thermistor 302 are provided. In one example, a printed circuit board or motherboard is provided which is connectable to the connectors, and the location holes 304 are provided to guide this board into place.

Figure 4:
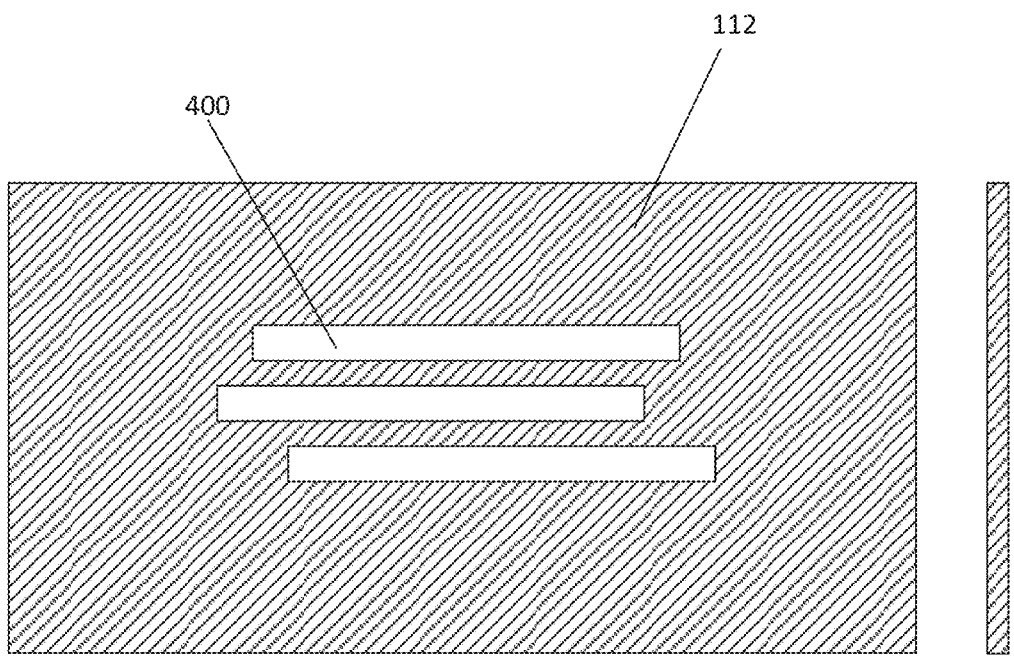
FIGS. 4(a) and (b) shows an example spacing plate of the radiating device of FIG. 1.

FIG. 4 shows the spacing element 112 described above with reference to FIG. 1. In the example shown there are three parallel apertures 400 which are locatable in register with the three rows of LEDs 104-1, 104-2, 104-3. This plate acts as a spacer so that the LEDs and wire bonds are protected from being damaged when pressed against the other components in the device. In other systems, LEDs and wire bonds are coated with epoxy in order to protect them. This epoxy can damage the connectors themselves upon application and in use, and also introduces another source of scattering for the light. The introduction of the spacing element 112 thus offers better protection for the LEDs and wire bonds and improves the optical properties of the system. In a preferred example, this plate 112 is less than 1 mm thick, and preferably 0.51 mm thick.

The plate 112 is preferably ceramic, due to its advantageous thermal properties. Ceramic materials have a low thermal conductance, which means that heat produced by the LEDs is not transferred to the radiation modification plate 114 which could adversely affect its optical properties of the plate 114.

Figure 5:
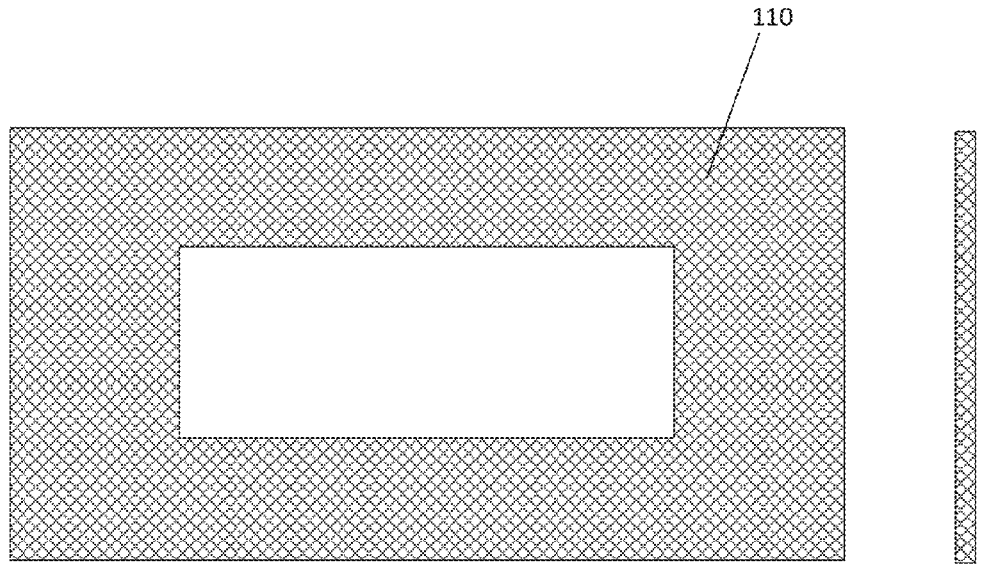
FIGS. 5(a) and (b) show an example front thermal pad of radiating device of FIG. 1.
Figure 6:
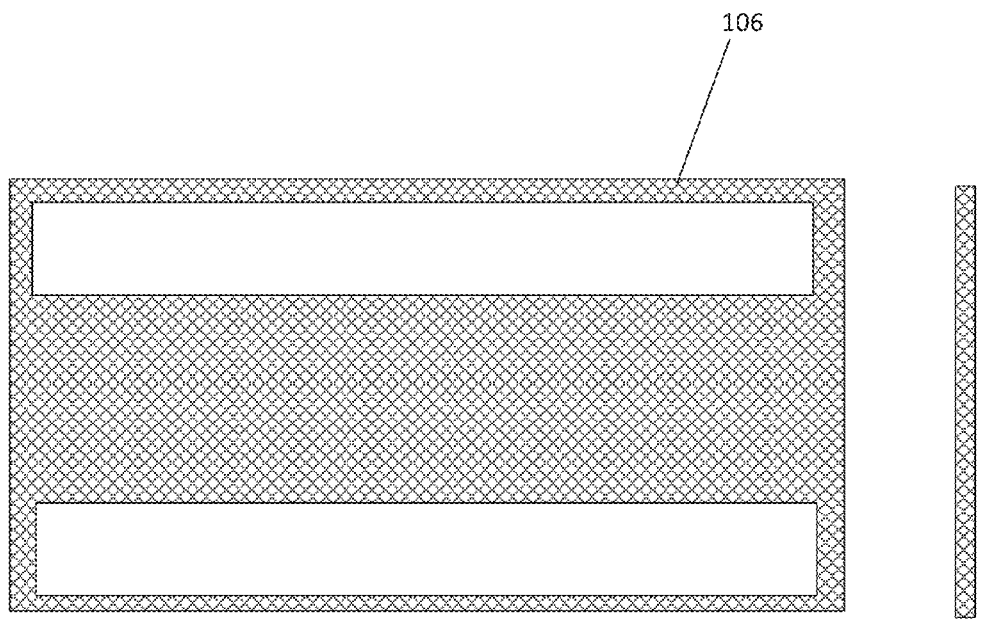
FIGS. 6(a) and (b) show an example rear thermal pad of the radiating device of FIG. 1.

FIGS. 5 and 6 show the thermal pads which were described above in relation to FIG. 1. The front thermal pad 110 is shaped to correspond with the shape of the substrate 102. It has an aperture large enough to accommodate the ceramic plate 112 and the radiation modification plate 114.

The back thermal pad 106 is similarly sized, but has two apertures which correspond in size and position to the connectors 300 provided on the rear face of the substrate 102.

Each pad has a high thermal conductivity so as to draw heat from the substrate 102 (where the LEDs 104 are producing heat) and conduct it to the front 116 and back 108 plates respectively, which dissipate the heat into the surroundings. The pads 110, 106 are in thermal contact with both the substrate 102 and the front 116 or back 108 plate. In a preferred example, they are less than 1 mm thick, and preferably 0.67 mm thick.

Figure 7:
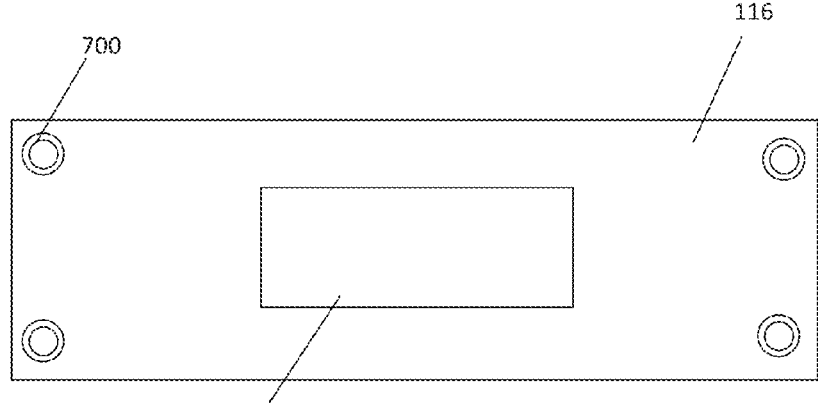
FIGS. 7(a) and (b) show an example top plate of the radiating device of FIG. 1.
Figure 8:
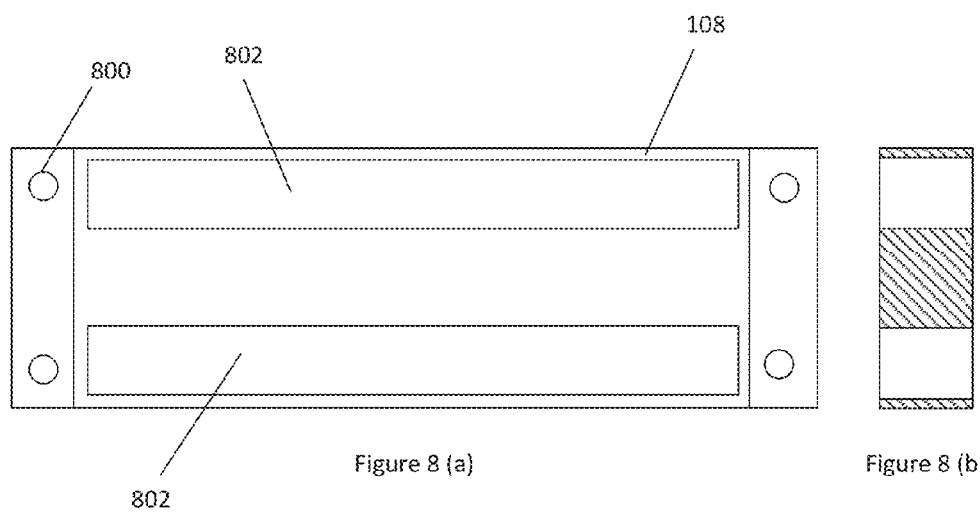
FIGS. 8(a)-(c) show an example back plate of the radiating device of FIG. 1.
Figure 8:

FIGS. 7 and 8 show the top plate 116 and back plate 108 of the radiating device. The faces of these plates have a size larger than the that of the other components, but correspond with one another. This is so that screws 118 can pass through holes 700 and fasten into corresponding screw-threaded cavities 800 in the back plate 108 without interfering with intermediate components. The act of tightening these screws 118 secures the components together, thereby 'sandwiching' them in place. To avoid damaging the components, a gasket may be introduced between the front and back plates, and/or between any other pair of layers within the 'sandwich'.

The front plate has an aperture 702 of a size corresponding to that of the radiation modification plate 114 and ceramic plate 112. The aperture 702 is preferably shaped so that the top (print medium facing) edge protrudes slightly so as to hold the plates 114, 112 in place when secured. This is shown in FIG. 1(b). Alternatively or in addition the plates may be secured together in some other manner, for example, they may be glued together.

The back plate 108 has two apertures 802 which are shaped so as to allow access to the electrical connectors 300 of the substrate plate 102. FIGS. 8(b) and (c) show that the back plate 108 has a depth far greater than any other component, preferably 10 mm thick. This is to aid in its role as a heat sink. The plate 108 is made from a material with a high thermal conductance, preferably aluminium. The extra depth provides greater heat capacity and thus serves as a more efficient heat sink.

Alternatives and Modifications

The above description mainly focuses on one example of a radiating device. There are of course numerous alternatives and modifications that can be made and still remain within the scope of the invention.

For example, although the above description and corresponding figures describe an RBG macro-LED array as being the light source, other arrangements are possible, and preferable in certain circumstances. An alternative arrangement would be to have an LED array of Infra Red (IR) and/or Ultra Violet (UV) LEDs. This arrangement would enable the device to print onto optically sensitive media.

The examples shown above all describe a distinct print head radiating device, but it is envisaged that a plurality of such radiating devices will be coupled together to form part of a much larger print head, that is, a bar-like structure.

In an LED printhead, the light produced at the bottom of the radiating device as described above is often not of a small enough spot size to generate high resolution images on the print media. In order to rectify this, the radiating device is attached to an apparatus which reduces the spot size. This could be in the form of a 'tapered fibre', details of which are described in WO0135633 published 17 May 2001 with the title 'Digital Photographic Reproduction Apparatus' which is hereby incorporated in its entirety by reference. Alternatively, this reduction could be performed by a lens system as described below.

In order to get the required resolution for the final printed article, the accurate control of exposure to the medium is required. The size of an area which is exposed by a single LED is called the 'spot size' and is often the limiting factor of the resolution of the printed article. For this reason, reduction of the spot size is an essential function of a high resolution LED printer. As discussed above, one solution is to use a 'fibre taper'. This is a bundle of optical fibres which are heated and pulled to form an hourglass shaped bundle which is then cut in half. This generates a device which focuses light entering the bundle down onto a smaller spot size. An alternative solution is to use a telecentric lens system as described below.

In the description that follows, the object aperture of the lens system is the aperture which is to be illuminated by the LEDs and the image aperture is the aperture of the lens system which projects the image onto the print medium.

FIG. 9 shows a schematic ray diagram of a bi-telecentric lens system. Telecentric lenses are different from standard lens systems as they correct for perspective. For this reason they are used in the imaging of objects such as apertures or objects which are vibrating. The correction for perspective in these situations allows a user to accurately measure the size of an aperture or vibrating object, which would be difficult when using a standard lens due to magnification changes or distortion due to lack of focus. The property which allows these effects is that for a range of distances there is effectively a constant magnification.

This means that the spot size produced by an LED illuminating a telecentric lens will be substantially constant for a range of distances away from the image aperture. This range of distances is called the 'depth of field' of the system. Conventional lens systems have a very limited depth of field, which results in large errors when a part of the print medium is at a different distance from the previous part. For example, the depth of field of the 'fibre taper' described above is in the micron range whereas for a typical telecentric lens system it is in the millimetre range. The image lens 950 can be adjusted in the system, moved longitudinally along the axis of the lens so as to 'fine tune' the magnification factor. This may be necessary as two telecentric lenses produced to the same specification may have slightly different magnification factors. In order to correct for this, a grid is imaged through a lens, and matched up to a calibration grid by altering the position of the image lens 950 via bevel adjuster 906 (FIG. 10). In one example, the lens 950 can be adjusted by up to 0.5 mm using the bevel adjuster 906.

The depth of field of a telecentric lens is determined by two factors—the tolerable error in magnification and the 'telecentric slope' of the lens by the following formula:

$$DOF = \frac{\Delta M \cdot 180}{t \cdot \pi}$$

Where DOF=Depth of field range

ΔM=Change in spot size radius (in the same units as DOF)

t=Telecentric slope of lens ('telecentricity'—in degrees)

For example, if the medium can be placed with an accuracy of 1 mm (required DOF) of the lens and the telecentricity of the lens is 0.15°, the change in spot size radius is 2.6 μm over that 1 mm range. For the system as described herein, where the final spot size diameter is 80 μm, this is error of around 3%. This error increases linearly with increasing telecentricity, so a lower limit on the quality of the telecentric lens can inferred from the maximum error tolerable.

A more general formula for determining the error in spot size as a percentage of the final spot size is given by:

$$\% = \frac{DOF \cdot t \cdot \pi}{l \cdot mf \cdot 180} \times 100$$

Where l=Initial spot size (size of each LED)

mf=Magnification factor (e.g. a 5:1 lens gives mf=0.2)

For example, if the error tolerable in a system as shown in FIG. 10 and table 1 below is 5%, and the required DOF is 1 mm, the highest telecentricity the lens could have would be 0.23°. In a preferred embodiment, the lens has a telecentricity of below 0.2°, even more preferably below 0.15°.

In one example, where UV LEDs 104 are used the lens is preferably constructed from UV transparent materials such as fused quartz or fused silica. A corollary of using such materials, and to a lesser extent, standard glass, is that the transmission properties are significantly improved. In one example, the intensity of light is increased by 95% compared to a fibre taper.

FIG. 10 shows an example telecentric lens 900 adapted for use with the RBG LED radiating device 100 described above. The print medium 904 and an illumination source 902 have been included in order to show relative distances. Table 1 below describes preferred properties and characteristics of this example:

TABLE 1

Properties of an example telecentric lens adapted for use with RBG LEDs

| Item | Design |
|---|---|
| Type of lens | Bi-telecentric |
| Effective Focal length | 540.24 mm |
| Magnification | 0.21167x (4.72:1) |
| Effective F# | 2.8 |
| Object space NA (LED side) | 0.037 |
| Object size (A) | 38 mm (diameter) |
| Image size (B) | 8.07 mm (diameter) |
| Working distance (LED side) (C) | 5-6 mm |
| Working distance (image side) (D) | 11.54 mm |
| Depth of field (LED side) | 0.224 mm |
| Depth of field (medium side) | 1.06 mm |
| Spectral range | 400-750 nm |

Figure 11:
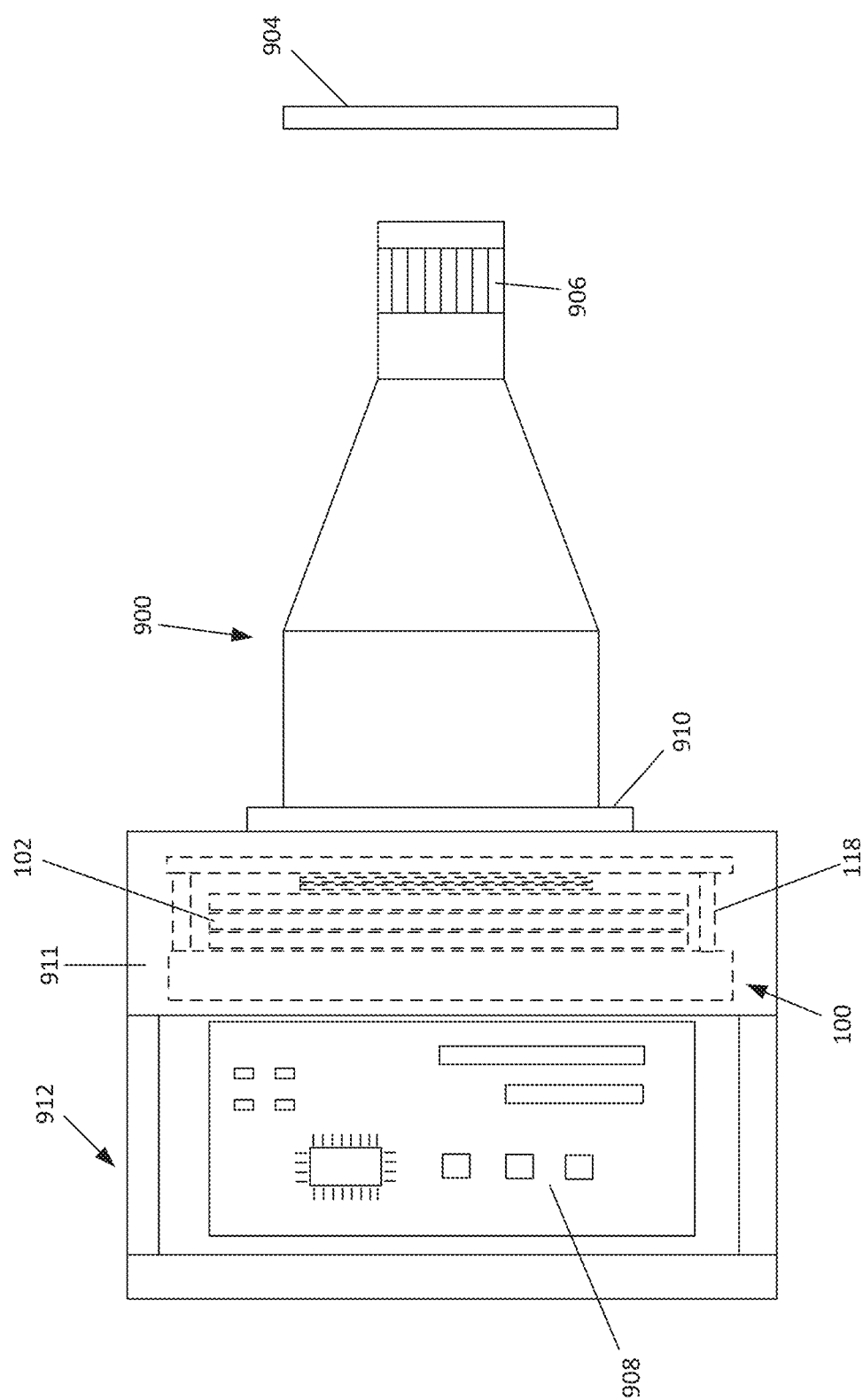
FIG. 11 shows a schematic diagram of the telecentric lens of FIG. 10 connected to the radiating device of FIG. 1 and a cage mount.

In one example, shown schematically in FIG. 11, the telecentric lens 900 described above is used in combination with the LED radiating device 100, also described above, to produce a media exposure device. The telecentric lens 900 is optically coupled to the radiating device 100 by mechanically connecting the radiating device 100 to the lens 900 using a mechanical coupling 912, in the form of a cage mount 912. A base portion 911 of the cage mount 912 is attached to a flange 910 which is itself attached to the top of the telecentric lens 900. This cage mount 912 houses the radiating device 100 and a plurality of controlling motherboards 908. The radiating device 100 fits into a recess provided in the base portion 911 of the cage mount 912. The radiating device 100 is shown expanded for clarity. The motherboards 908 contain the necessary electronics to power, control and cool the LEDs 104. The motherboards 908 are connected to the connectors 300 on the substrate 102 via a further printed circuit board having push connectors, extended pins, or other suitable connecting means, which pass through the apertures in the back plate 108 and rear thermal pad 106. In one example, the lens 900 is mounted 5 mm below (closer to the print medium 904) the LED substrate 102 for optimum operation.

Figure 12:
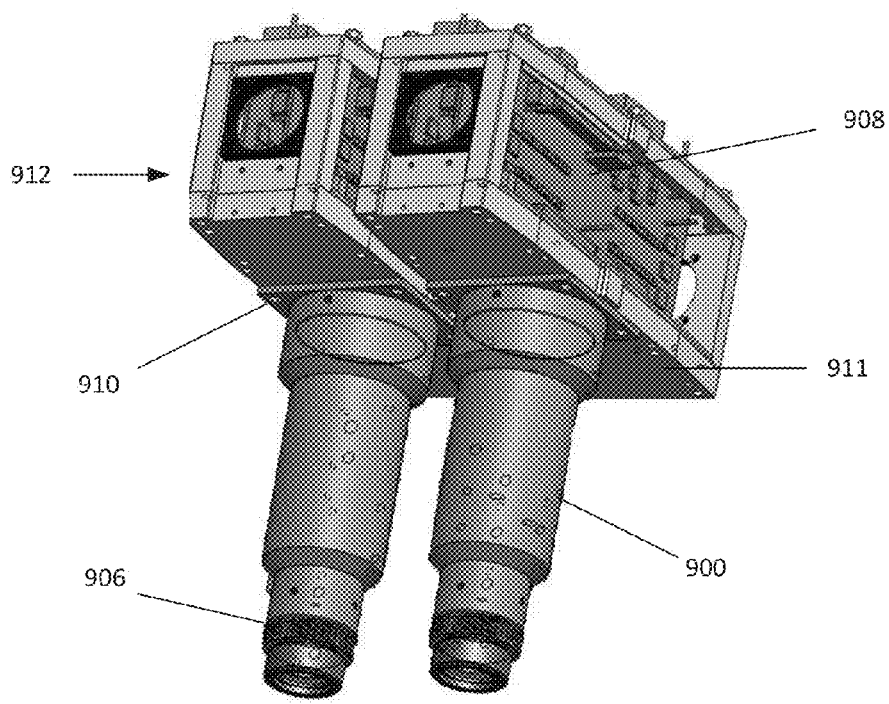
FIG. 12 shows two telecentric lenses of FIG. 11 connected together.

FIG. 12 shows a diagram of two such lenses 900 and cage mounts 912 as described above. An advantage of having multiple devices on the same printhead is that each swathe of print is wider, resulting in faster printing. For this to be possible, accurate alignment of the swathes is necessary, which is discussed in below with reference to FIGS. 13 and 14.

Figure 13:
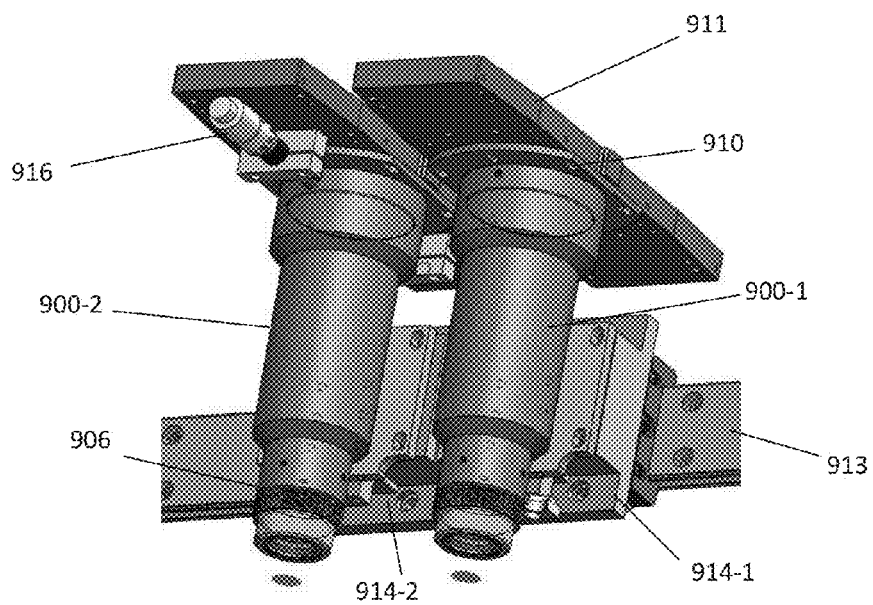
FIG. 13 shows the telecentric lenses of FIG. 12 in an alignment stage.

FIG. 13 shows a diagram of two lenses 900 which during an alignment process. The first lens 900 is attached to a mounting bar 913 using a 'key-slot mount' 914-1. This aligns the lens vertically (i.e. at the correct distance from print medium) and ensures it is orthogonal to the print medium. The mounting bar 913 in one example is a print bar along which the print head moves when producing a swathe of print. The second lens is attached to the same print bar 913 by a second key-slot mount 914-2. This is set back longitudinally along the bar 913 by a preset amount, and also laterally offset perpendicular to the bar 913 by a preset amount. This lateral distance sets the distance between the swathes, and must be very accurate otherwise 'banding' will occur as discussed above. The longitudinal distance it is set back along the bar 913 does not affect this so does not necessarily need to be finely controlled. The process of aligning the second swathe from the second lens 900-2 with respect to the first is described in detail below.

A micrometer 916 is attached to the underside of the cage mount 912 and contacts the lens 900-2. The bolts securing the lens 900-2 to the cage mount 912 are loosened or removed. This allows the cage mount 916 (and hence the position of the LEDs 104) to be moved relative to the lens 900-2. In one example, the bolt holes are slots so that the bolts can be loosened, then the adjustment to position can be made, then re-tightened. This movement is focused by the lens 900-2, so a 0.1 mm movement of the micrometer results in a 20 μm movement of the swathe at the print medium (for a lens with a magnification factor of 5:1). This allows for the accurate positioning of the second swathe. The second lens 900-2 is positioned as accurately as possible to begin with using the key-slot mount 914-2, as only a limited amount of movement can be achieved using the micrometer 916 before the LEDs 104 move out of the lens' field of view. Although FIGS. 12 and 13 show two lenses 900-1, 900-2, any number may be arranged onto a print bar using the method described. A physical limit on the number of lenses may occur however when the weight of additional lenses may make it quicker and more accurate to print using multiple passes of smaller swathes rather than in one large swathe.

Figure 14:
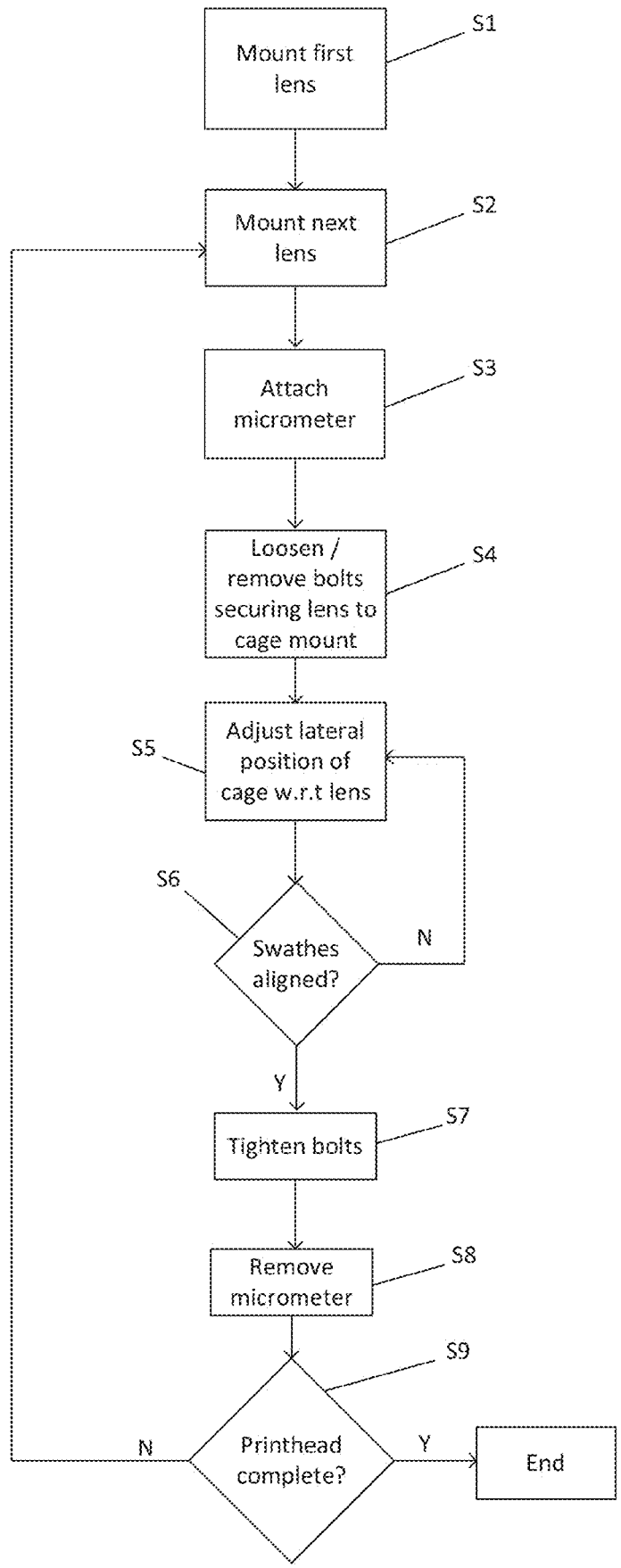
FIG. 14 shows a flow diagram of an alignment process.

FIG. 14 shows a flow diagram of the method used to align an additional swathe with the previous swathe. In step S1, the first lens 900-1, together with its radiating device 100 (not shown) is mounted onto the print bar 913 using the key-slot mount 914 described above. The second lens 900-2 is then mounted in a similar fashion in step S2, offset laterally and longitudinally from the first lens 900-1. A micrometer 916 is attached to the lower panel of the cage mount 911 adjacent to the second lens 900-2 and contacts the second lens 900-2 itself in step S3. The bolts securing the lens 900 to the cage 911 are loosened/removed in step S4 so that adjustment of their relative positions can take place in step S5. This step involves moving the cage 911 (and hence LEDs 104) relative to the lens 900-2 so that the swathes coincide. In the example of the RBG LED strips 104-1, 104-2, 104-3 above, this is where the 'G' strip coincides with the 'R' strip from the neighbouring array. In one example, there may be some overlap as when the apparatus is in use it expands due to the raised temperature. Such calibration can be worked out once and then used for all subsequent alignments. Step S6 indicates the feedback loop used to effect the alignment of the swathes. The swathes may be compared by exposing a photosensitive media, or by passing the heads over a camera. When the swathes are suitably aligned, the bolts are tightened in step S7 and the micrometer 916 is removed in step S8. If the printhead is complete (step S9), the process terminates, if another lens 900 is to be added, the process returns to step S2.

Table 2 shows example properties of a telecentric lens adapted for use with UV LEDs.

TABLE 2

Properties of an example telecentric lens adapted for use with UV LEDs

| Item | Design |
|---|---|
| Type of lens | Bi-telecentric |
| Effective Focal length | 394 mm |
| Magnification | 0.10x (10:1) |
| Working F# | 2.8 |
| Object space NA (LED side) | 0.035 |
| Image space NA | 0.178 |
| Field of view (LED side) (A) | 48 mm (diameter) |
| Image size (B) | 4.0 mm (diameter) |
| Working distance (LED side) (C) | 5.0 mm |
| Working distance (image side) (D) | 10 mm |
| Distant of Object to Image (O/I) | 130 mm |
|  | (<150 mm) |
| Telecentricity | 0.15° |
| Optical distortion | <0.1% |
| Relative illumination | >98% |
| Transmission | >70% |
| Spectral range | >365 nm (UV LED) |

Although the above lenses are described as bi-telecentric, it is envisaged that a lens with just image-space telecentricity may be used. This would suffice as the positioning of the LEDs relative to the object aperture of the lens (distance C) can be controlled to a great degree of accuracy and reproducibility, and does not change once mounted. Conversely, the image side distance D is subject to variation as the print medium is moved for example. It is thus far more important to have image-space telecentricity than object-space telecentricity.

It will be understood that the present invention has been described above purely by way of example, and modifications of detail can be made within the scope of the invention.

Reference numerals appearing in the claims are by way of illustration only and shall have no limiting effect on the scope of the claims.

The invention claimed is:
1. A radiating device, including:
a holding structure;
a substrate having a plurality of diodes mounted thereon; and
a radiation modification element for modifying radiation emitted by the diodes;
wherein the radiation modification element includes a plate which allows the passage therethrough of radiation; and
wherein the radiation modification element includes a mask for masking the radiation in the form of an opaque layer deposited on said plate which is opaque to the radiation, the mask defining a number of apertures, each aperture substantially being in register with the radiation path of a particular one of the diodes;
wherein the radiation modification element further includes a filter for filtering the radiation, wherein said radiation filter is deposited on said opaque layer on said plate;
the substrate and the radiation modification element being secured by the holding structure in an arrangement wherein the diodes can emit radiation from the device and wherein the radiation modification element is spaced from the diodes in the radiation path of the diodes.
2. The radiating device according to claim 1, wherein the mask is deposited on the plate via vapour deposition.
3. The radiating device according to claim 1, wherein the filter includes at least one radiation filter layer.

4. The radiating device according to claim 1, wherein each radiation filter layer covers at least a portion of the apertures.

5. The radiating device according to claim 4, wherein each radiation filter layer is deposited on the opaque layer via vapour deposition.

6. The radiating device according to claim 4, wherein each radiation filter layer is deposited on the opaque layer via hand painting.

7. The radiating device according to claim 4, wherein each radiation filter layer is in the form of a gelatine filter deposited on the opaque layer.

8. The radiating device according to claim 1, wherein the diodes are light emitting diodes emitting electromagnetic radiation substantially within the visible spectrum.

9. The radiating device according to claim 1, wherein the diodes are light emitting diodes emitting electromagnetic radiation substantially within the ultra violet and/or infrared spectrum.

10. The radiating device according to claim 1, wherein the radiation modification element is in the form of a glass plate.

11. The radiating device according to claim 1, wherein the radiation modification element is an optic fibre plate in which the fibres are oriented with their axes substantially parallel to the radiation path of the diodes.

12. The radiating device according to claim 1, wherein the holding structure includes a spacing element disposed between the substrate and the radiation modification element.

13. The radiating device of claim 12, wherein the spacing element defines at least one opening and is disposed in an arrangement wherein each diode is in register with an opening of the spacing element.

14. The radiating device as claimed in claim 13, wherein the spacing element defines a number of slots, each slot being in register with a different subset of the diodes;
and preferably wherein the spacing element is in the form of a ceramic plate.

15. The radiating device according to claim 1, wherein the holding structure includes a base plate and a front plate adapted to be coupled to one another thereby to secure the other components of the device between said base and front plates.

* * * * *